United States Patent
Trattler et al.

(10) Patent No.: US 8,350,636 B2
(45) Date of Patent: Jan. 8, 2013

(54) MODULATION ARRANGEMENT AND METHOD FOR PROVIDING A MODULATED CONTROL SIGNAL

(75) Inventors: Peter Trattler, Graz (AT); Franz Stelzl, Hitzendorf (AT)

(73) Assignee: Austriamicrosystems AG, Unterpremstatten (AT)

( * ) Notice: Subject to any disclaimer, the term of this patent is extended or adjusted under 35 U.S.C. 154(b) by 581 days.

(21) Appl. No.: 12/419,969

(22) Filed: Apr. 7, 2009

(65) Prior Publication Data

US 2009/0251230 A1    Oct. 8, 2009

(30) Foreign Application Priority Data

Apr. 8, 2008   (DE) .......................... 10 2008 017 774

(51) Int. Cl.
*H03K 7/08* (2006.01)
(52) U.S. Cl. ......... 332/109; 332/110; 332/112; 332/113
(58) Field of Classification Search ................... 332/109, 332/110, 112, 113; 341/143
See application file for complete search history.

(56) References Cited

U.S. PATENT DOCUMENTS

| | | | |
|---|---|---|---|
| 7,999,484 B2 * | 8/2011 | Jurngwirth et al. | ........... 315/247 |
| 2004/0240540 A1 | 12/2004 | Matsushima | |
| 2007/0176810 A1 | 8/2007 | Lee | |
| 2008/0048582 A1 | 2/2008 | Robinson | |

FOREIGN PATENT DOCUMENTS

| | | |
|---|---|---|
| DE | 103 57 776 | 7/2005 |
| DE | 203 80 325 | 8/2005 |
| EP | 0 545 077 | 10/1992 |
| WO | WO 2007/071033 | 6/2007 |

* cited by examiner

*Primary Examiner* — Joseph Chang
*Assistant Examiner* — Jeffrey Shin
(74) *Attorney, Agent, or Firm* — Cozen O'Connor

(57) ABSTRACT

A modulation arrangement comprises an input (E) for supplying a data signal (DS), a pre-modulator (VMod) that is coupled to the input (E) and features a clock pulse input (TEV) for supplying a pre-clock pulse (VT), a main modulator (HMod) that is coupled to the pre-modulator (VMod) on the input side and comprises a clock pulse input (TEH) for supplying a main clock pulse (HT), as well as an output for providing a modulated control signal (ST), and a switchable current source (Q, S) for providing a current (IS) that is controlled by the modulated control signal (ST) at an output (A) of the modulation arrangement. Furthermore, a method for providing a modulated control signal is disclosed.

12 Claims, 2 Drawing Sheets

MODULATION ARRANGEMENT AND METHOD FOR PROVIDING A MODULATED CONTROL SIGNAL

RELATED APPLICATIONS

This application claims the priority of German Patent Application No. 10 2008 017 774.1 filed Apr. 8, 2008.

FIELD OF THE INVENTION

The invention pertains to a modulation arrangement, to a control arrangement for use in a portable device and to a method for providing a modulated control signal.

BACKGROUND OF THE INVENTION

In the control of electrical loads such as light-emitting diodes or LEDs, DC/DC converters are frequently used in connection with pulse-width modulated signals in order to control, for example, the brightness of the LEDs. If the frequency of this pulse-width modulated signal is less than 20 kHz, a capacitor such as an output capacitor of the DC/DC converter may create audible noise due to a piezoelectric effect. This noise is annoying in devices that are located near the ear of a user, for example, in mobile or cordless telephones. In order to prevent this noise, the frequency of the pulse-width modulated signal used would have to be above 20 kHz. When using n bits for the pulse-width modulation, the clock frequency of a pulse-width modulator that generates the pulse-width modulated signal therefore would have to be $2^n \times 20$ kHz. Even in pulse-width modulations with a low resolution of n=5 bits, this leads to very high frequencies of 5.1 MHz. Higher resolutions of n=12 bits actually require a clock frequency of 81 MHz. These high clock frequencies result in undesirably high power consumption, particularly in mobile applications.

SUMMARY OF THE INVENTION

An objective of the present invention is to provide an arrangement and a method for a low-noise pulse-width modulation.

This and other objects are attained in accordance with one aspect of the present invention directed to a modulation arrangement comprising an input for receiving a data signal, a pre-modulator, a main modulator and a switchable current source. The pre-modulator is coupled to the input of the modulation arrangement and features a clock input for receiving a pre-clock pulse. The main modulator is coupled to the pre-modulator on the input side and has a clock input for receiving a main clock pulse, as well as an output for providing a modulated control signal. The switchable current source supplies current that is controlled by the modulated control signal at an output of the modulation arrangement.

The data signal supplied to the input of the modulation arrangement is subjected to a first modulation in the pre-modulator. The main modulator carries out a second modulation and provides the modulated control signal. The modulated control signal controls the switchable current source. The output of the modulation arrangement supplies the current for controlling an electrical load which can be connected to this output.

Since the modulated control signal is obtained from the data signal by means of the proposed two-stage modulation, a low-noise modulated control signal is advantageously provided. The frequencies for the pre-clock pulse and the main clock pulse may be advantageously chosen such that the power consumption is optimized while simultaneously ensuring a high-resolution pulse-width modulation.

In one embodiment, the data signal comprises a binary digital signal with a width of n bits.

In an additional refinement, the pre-modulator for providing a first intermediate signal with a width of one bit by modulating a first part of the data signal is coupled to the input of the modulation arrangement. The first part of the data signal comprises a first subset u of low-order bits of the data signal.

The subset u of low-order bits of the data signal is modulated with the pre-clock pulse in the pre-modulator into the first intermediate signal with a width of 1 bit.

In another embodiment, the main modulator is coupled to the pre-modulator by means of a combination device.

In an additional refinement, the combination device comprises an input for supplying the first intermediate signal, another input for supplying the second part of the data signal and an output for providing a second intermediate signal with a width of m bits. The second part of the data signal comprises a second subset v of higher-order bits of the data signal. The output of the combination device is coupled to the input of the main modulator.

The combination device links the bit of the first intermediate signal to the bits of the second part of the data signal and, in dependence thereon, provides the second intermediate signal with a width of m bits at the input of the main modulator.

In another embodiment, the sum of the first subset u and the second subset v corresponds to the number n of bits of the data signal. The second subset v is smaller than the number m of the bits of the second intermediate signal by 1.

In an additional refinement, the combination device comprises a unit for shifting all bits of the second part of the data signal to the left by one position, as well as a unit for adding the second intermediate signal.

The second intermediate signal is generated by shifting the bits of the second part of the data signal to the left and adding the one bit of the first intermediate signal.

In an alternative embodiment, the combination device comprises a unit for adding the first intermediate signal and the second part of the data signal, as well as a unit for appending a carry of the addition to a lowest-order position of the second intermediate signal.

The second intermediate signal is generated by adding the one bit of the first intermediate signal to the v bits of the second part of the data signal and appending the carry of the addition to the m-th position of the second intermediate signal.

In an additional refinement, the input of the modulation arrangement is coupled to the pre-modulator via a multiplication device for multiplying the data signal by an adjustable factor. The adjustable factor can preferably be chosen in dependence on the data signal. A division device for dividing the current by the adjustable factor is connected in series upstream to the switchable current source.

In another embodiment, the adjustable factor is chosen in the form of a multiple of 2 such that a highest-order bit of the data signal assumes the value 1 after the multiplication.

Due to the multiplication, a larger portion of the n bits of the data signal lies in the higher frequency range. In addition, the amplitude of the low-order bits is additionally reduced. Noise is advantageously reduced even further.

In another embodiment, the modulated control signal is provided at a frequency higher than 20 kHz and with a width of 1 bit. The frequency of the modulated signal can be chosen in accordance with the users of a device featuring the modulation arrangement in such a way that it lies above the audible range of these users.

The frequency of the modulated control signal advantageously lies outside the audible range and therefore does not generate audible noise.

In an additional refinement, the main clock pulse is the product of the pre-clock pulse and an exponential expression of an exponent and the base 2. The exponent is formed by the number m of bits of the second intermediate signal.

Due to the fact that the modulation is carried out in two stages and the data signal is accordingly divided into two parts, the frequencies of the main clock pulse and the pre-clock pulse can advantageously be chosen such that the frequency of the modulated control signal lies outside the audible range and the current consumption is actually minimized. This means that the requirements with respect to the linearity of the switchable current source are also lower.

In another embodiment, the pre-modulator and/or the main modulator comprise(s) a pulse-width modulator or a sigma-delta modulator. This results in six different optional combinations for the pre-modulator and/or the main modulator of the two-stage modulation.

In one embodiment, the control arrangement for use in a portable device comprises an above-described modulation arrangement, as well as a DC/DC converter. A first terminal of an electrical component can be connected to the output of the modulation arrangement in order to control said component. The DC/DC converter can be connected to a second terminal of the electrical component in order to supply an output voltage. The DC/DC converter may be realized, for example, in the form of an inductive boost-converter, a buck-converter or a buck/boost converter. Furthermore, the DC/DC converter may be implemented in the form of a charge pump.

The DC/DC converter supplies the output voltage for operating the electrical component. The two-stage modulation transforms the data signal supplied to the modulation arrangement into the modulated control signal that controls the current flow through the connectable electrical component with the aid of the switchable current source.

The control arrangement may be realized, for example, in the form of an integrated circuit on a semiconductor chip with two pins for connecting the electrical component that comprises, for example, light-emitting diodes.

The electrical component can be advantageously controlled by means of the high-resolution, pulse-width modulated control signal without generating audible noise. This also applies in connection with an output capacitor of the DC/DC converter. Due to the intermediate frequencies used for the two modulation stages, the current consumption of the control arrangement and the requirements with respect to the linearity of the switchable current source are advantageously low.

Another aspect of the present invention is directed to a method for providing a modulated control signal comprising the steps of supplying a data signal with a width of n bits, modulating the first part of the data signal and providing a first intermediate signal, combining the first intermediate signal with a second part of the data signal and providing a second intermediate signal, as well as modulating the second intermediate signal and providing the modulated control signal. The data signal comprises n bits. The first part of the data signal comprises a first subset u of the n bits. The first intermediate signal has a width of one bit. The second part of the data signal comprises a second subset v of the n bits. The second intermediate signal has a width of m bits. The modulated control signal has a width of one bit.

The data signal is modulated in two stages, wherein the low-order bits of the data signal are pre-modulated in a first step and a combination of the pre-modulated low-order bits and the higher-order bits of the data signal is modulated in the second step.

Due to these measures, a frequency of the modulated control signal that is provided can advantageously be chosen such that it lies outside the audible range and the required clock frequencies for the preliminary modulation and the main modulation actually lie in the intermediate range.

In an additional refinement, the step of combining the first intermediate signal with the second part of the data signal comprises shifting all bits of the second part of the data signal to the left by one position and appending the bit of the first intermediate signal to a lowest-order position of the second intermediate signal.

In an alternative embodiment, the step of combining the first intermediate signal with the second part of the data signal comprises adding the second part of the data signal and the first intermediate signal and appending a carry of the addition to a lowest-order position of the second intermediate signal.

In another embodiment, the step of supplying the data signal comprises multiplying the data signal by a multiple of the factor two.

BRIEF DESCRIPTION OF THE DRAWINGS

Several embodiments of the invention are described in greater detail below with reference to the figures. Elements that function or act identically are designated by the same reference signs. With respect to components that fulfill corresponding functions, the description of said components is not repeated in each of the following figures. The figures show.

DETAILED DESCRIPTION OF THE DRAWINGS

Figure 1:
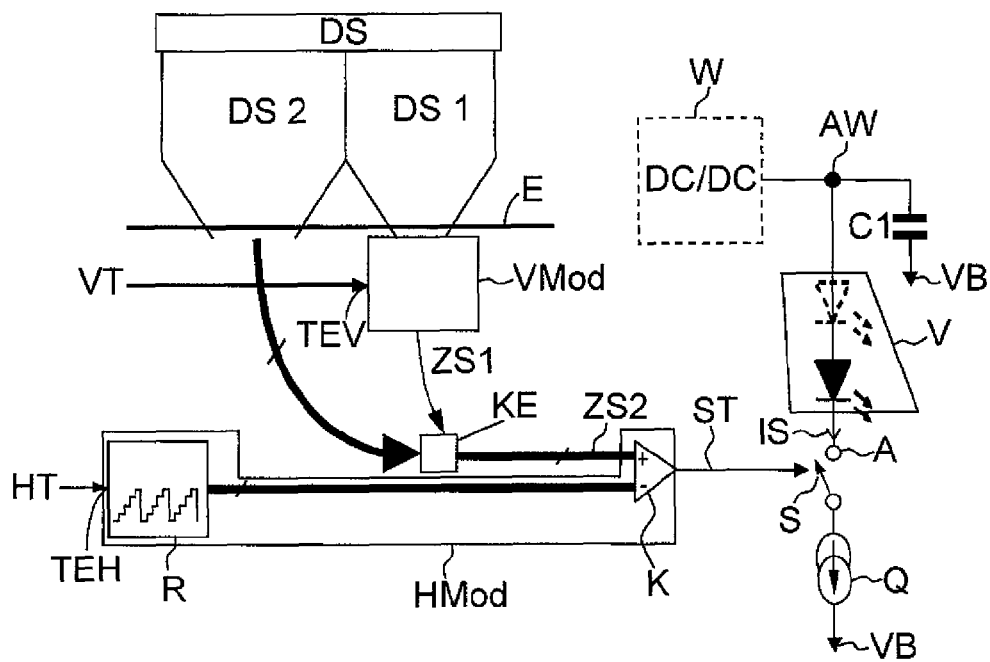
FIG. 1 an exemplary embodiment of a control arrangement with a modulation arrangement according to the invention.

FIG. 1 shows an exemplary embodiment of a control arrangement with a modulation arrangement according to the invention. The control arrangement comprises a DC/DC converter W and a modulation arrangement. The DC/DC converter W features a converter output AW. An output capacitor C1 that is connected to the converter output AW and to a reference potential connection VB is illustrated outside the DC/DC converter W in order to provide a better understanding, but forms part of said converter. The modulation arrangement features an input E for supplying a data signal DS, an output A for providing a current IS, a pre-modulator VMod, a combination device KE, a main modulator HMod and a switchable current source Q, S. The data signal DS is a binary data signal with a width of n bits. It comprises a first part DS1 that features a subset u of low-order bits of the data signal DS, as well as a second part DS2 that features a subset v of higher-order bits of the data signal DS.

The pre-modulator VMod comprises a pulse-width modulator or a sigma-delta modulator. The pre-modulator VMod is coupled to the input E of the modulation arrangement and features an output for providing a first intermediate signal ZS1. Furthermore, the pre-modulator VMod features a pre-clock pulse input TEV for supplying a pre-clock pulse VT.

The combination device KE features an input for supplying the first intermediate signal ZS1, another input for supplying the second part DS2 of the data signal DS and an output for providing a second intermediate signal ZS2. The first intermediate signal ZS1 has a width of one bit. The second intermediate signal ZS2 has a width of m bits. The combination device KE comprises a unit for shifting the bits of the second part DS2 of the data signal DS to the left by one position, as well as a unit for adding the bit of the first intermediate signal ZS1 to the shifted bits of the second part DS2 of the data signal DS.

The main modulator HMod features an input for receiving the second intermediate signal ZS2, a main clock pulse input TEH for receiving a main clock pulse HT and an output for providing a modulated control signal ST. The main modulator HMod comprises a ramp generator R and a comparator K. A clock pulse input of the ramp generator R forms the main clock pulse input TEH of the main modulator HMod. An output of the ramp generator R is connected to an input of the comparator K. Another input of the comparator K forms the second input of the main modulator HMod that serves for receiving the second intermediate signal ZS2. The switchable current source Q, S comprises a current source Q and a switch S. The current source Q is connected to the switch S on the one hand and to the reference potential connection VB on the other. An electrical component V connected between the output A of the modulation arrangement and the converter output AW features, for example, one or more light-emitting diodes.

The subset u of the low-order bits of the first part DS1 of the data signal DS is converted into the first intermediate signal ZS1 with a width of 1 bit in the pre-modulator VMod by means of pulse-width modulation or sigma-delta modulation. The combination device KE adds the bit of the first intermediate signal ZS1 to the left-shifted v bits of the second part DS2 of the data signal DS and provides the second intermediate signal ZS2 with a width of m bits. Thereby, the quantities of the subsets u and v are specified such that their sum corresponds to the number n of bits of the data signal DS and such that the subset v is smaller than the number m of bits of the second intermediate signal ZS2 by 1. The second intermediate signal ZS2 is supplied to the comparator K and compared with the signal with a width of m bits generated by the ramp generator R. The modulated control signal ST with the width of 1 bit is provided at the output of the comparator K. The switch S is controlled by the modulated control signal ST and supplies the current IS at the output A of the modulation arrangement.

The modulated control signal ST has two frequency components. A main component is defined by the modulation of the higher-order bits of the second part DS2 of the data signal DS in the main modulator HMod. A second component is defined by the modulation of the low-order bits of the first part DS1 of the data signal DS in the pre-modulator VMod. The number m of the bits of the second intermediate signal ZS2 and the frequency of the main clock pulse HT are chosen such that the frequency of the modulated control signal ST being generated lies outside the audible range, i.e., above 20 kHz. For example, a frequency of 4 MHz is used for the main clock pulse HT. The data signal DS comprises, for example, n=12 bits. For example, m=7 bits are modulated in the main modulator HMod. Consequently, the modulated control signal ST has a frequency of 4 MHz÷$2^7$=31 kHz. The pre-clock pulse VT supplied to the pre-modulator VMod corresponds to the quotient of the frequency of the main clock pulse HT and $2^m$. In this example, the frequency of the pre-clock pulse VT amounts to 31 kHz in accordance with the quotient of 4 MHz and $2^7$. The first intermediate signal ZS1 therefore is provided with a frequency that corresponds to the quotient of the frequency of the pre-clock pulse VT and $2^u$. In the described example, the frequency of the first intermediate signal ZS1 is 488 Hz. The frequency of the first intermediate signal ZS1 can lie in the audible range below 20 kHz since the first intermediate signal ZS1 has a low amplitude due to the utilization of the low-order bits of the data signal DS, wherein the maximum amplitude of the first intermediate signal ZS1 is 1/64 of the full amplitude in this example.

The number n of the bits of the data signal DS can be advantageously chosen such that a high-resolution pulse-width modulation can be achieved without the output capacitor C1 and/or another capacitor generating audible noise in the circuit. The power consumption is advantageously low due to the low frequencies used for the pre-clock pulse VT and the main clock pulse HT. The requirements of the switch S with respect to its exact switch-on/switch-off characteristics are advantageously low due to the low frequencies used for the pre-clock pulse VT and the main clock pulse HT.

Alternatively, the main modulator HMod may also comprise a sigma-delta modulator instead of the pulse-width modulator shown.

Figure 2:
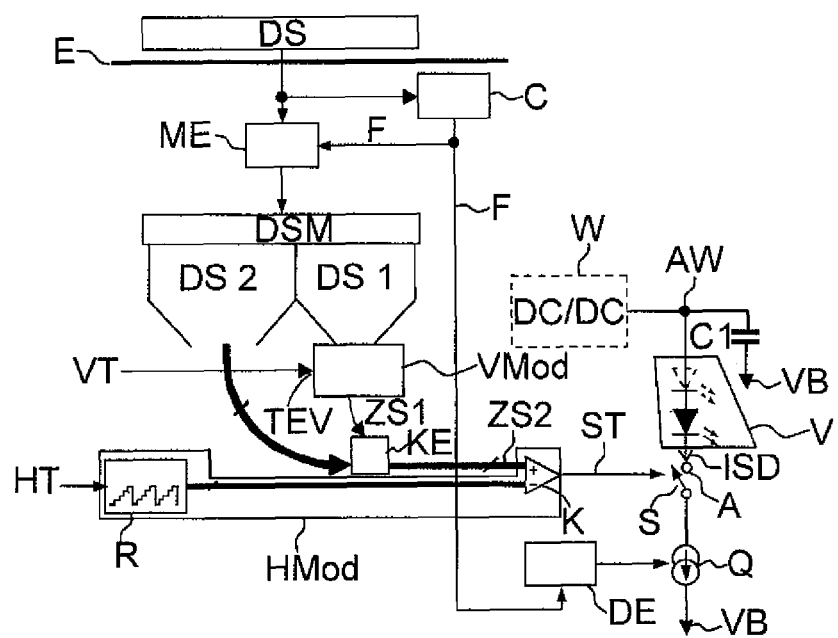
FIG. 2 another exemplary embodiment of a control arrangement with a modulation arrangement according to the invention, and FIG. 3 a third exemplary embodiment of a control arrangement with a modulation arrangement according to the invention.

FIG. 2 shows another exemplary embodiment of a control arrangement with a modulation arrangement according to the invention. The arrangement comprises the control arrangement of FIG. 1 and additionally a multiplication unit ME, a calculator C and a division unit DE. An input of the calculator C is connected to the input E of the modulation arrangement. An output of the calculator C is connected to an input of the multiplication device ME in order to provide a factor F, and to an input of the division device DE. Another input of the multiplication device ME is connected to the input E of the modulation arrangement in order to supply the data signal DS. An output of the division unit DE is connected to the current source Q so that it can be controlled.

The data signal DS is supplied to the input E of the modulation arrangement, as well as to the calculator C and the multiplication device ME. The calculator C determines the factor F with the aid of the bits of the data signal DS in such a way that the highest-order bit of the data signal DS is set with the factor F after a multiplication in the multiplication unit ME. For example, the factor F is set to 2 if the highest-order bit of the data signal DS is 0. If the highest-order bit and the adjacent bit of the data signal DS are 0, the factor F is set to 4. The bits of the data signal DS are multiplied by the factor F in the multiplication device ME and a multiplied data signal DSM is provided. The multiplied data signal DSM is divided into the first part DS1 and the second part DS2 and then supplied to the pre-modulator VMod and the main modulator HMod. As described above with reference to FIG. 1, the modulated control signal ST is provided. The current delivered by the current source Q is divided by the factor F with the aid of the division unit DE. Consequently, a divided current ISD that is controlled by the modulated control signal ST is provided at the output A of the modulation arrangement. Thereby, the average divided current ISD provided remains as high as the current IS provided at the output A of the modulation arrangement in FIG. 1. The following applies with respect to the current provided to the electrical component V:

$$ISD \cdot ST = \frac{IS}{F} \cdot DS \cdot F = IS \cdot DS$$

Here, ISD represents the value of the divided current ISD, ST represents the value of the modulated control signal ST, IS represents the value of the current IS, F represents the value of the factor F and DS represents the value of the data signal DS.

For example, the data signal DS has the value 01001010. The factor F is set to 2 in the calculator C. After the multiplication in the multiplication unit ME, the multiplied data signal DSM therefore has the value 10010100. Due to this multiplication, the higher-order bits of the data signal DS have more energy so as not to generate audible noise, as explained above with reference to FIG. 1. The energy of the low-order bits is reduced by the multiplication. Subsequently, the current supplied by the current source Q is cut in half due to the factor F, which is 2 in this case. This advantageously reduces the amplitude of the voltage changes at the converter output AW, wherein this advantageously contributes to improved electromagnetic compatibility of the entire circuit.

Figure 3:
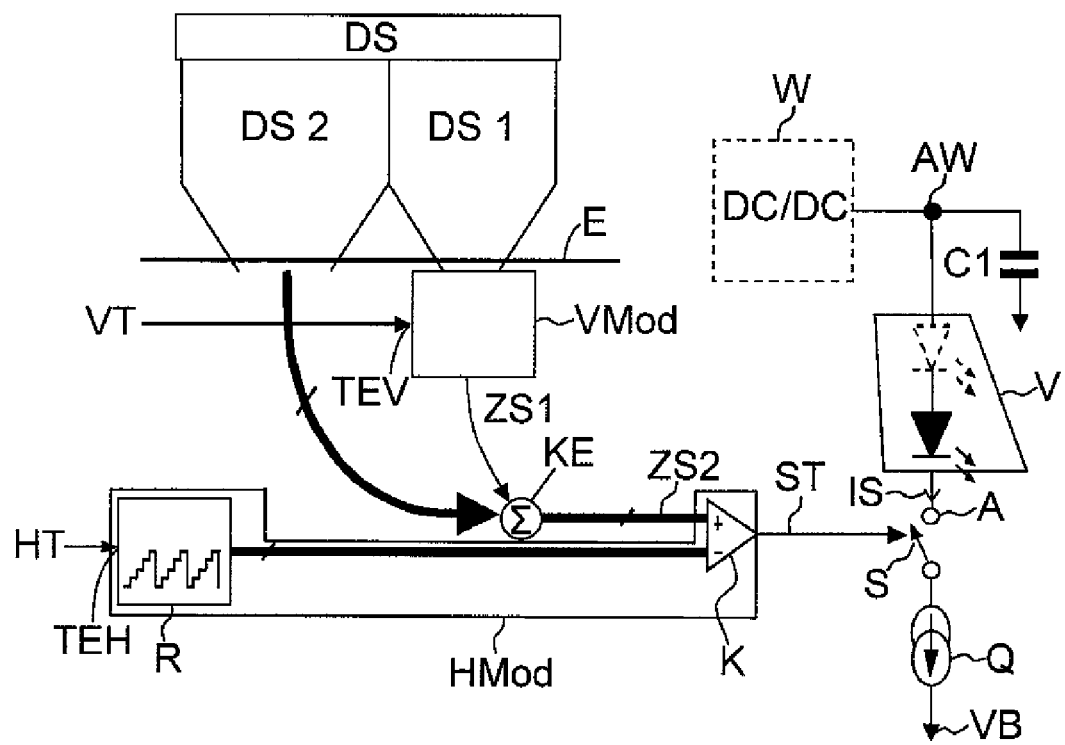

FIG. 3 shows a third exemplary embodiment of a control arrangement with a modulation arrangement according to the invention. The control arrangement essentially corresponds to the control arrangement shown in FIG. 1, but the combination unit KE comprises a unit for adding the first intermediate signal ZS1 and the second part DS2 of the data signal DS, as well as a unit for additionally appending a carry of the addition to the highest-order position of the second intermediate signal ZS2. The thereby created second intermediate signal ZS2 once again has a width of m bits and is conventionally supplied to the main modulator HMod.

Due to this arrangement, the frequency of the modulated control signal ST being generated advantageously lies above the audible range. This advantageously prevents audible noise from being generated due to capacitance of the circuit.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples

We claim:

1. A modulation arrangement comprising:
   an input for supplying a data signal;
   a pre-modulator coupled to the input and including a clock pulse input for receiving a pre-clock pulse;
   a main modulator coupled to the pre-modulator on the input side including a clock pulse input for receiving a main clock pulse, as well as an output for providing a modulated control signal; and
   a switchable current source for providing a current that is controlled by the modulated control signal at an output of the modulation arrangement,
   wherein the modulated control signal has a frequency higher than 20 kHz and a width of one bit,
   wherein the data signal comprises a binary digital signal with a width of n bits,
   wherein the pre-modulator is coupled to the input in order to provide a first intermediate signal with a width of one bit by modulating a first part of the data signal that comprises a first subset u of low-order bits of the data signal,
   wherein the main modulator is coupled to the pre-modulator by a combination device, and
   wherein the combination device comprises an input for receiving the first intermediate signal, another input for receiving a second part of the data signal that comprises a second subset v of higher-order bits of the data signal, and an output for providing a second intermediate signal with a width of m bits, and the output being coupled to the input of the main modulator.

2. The modulation arrangement according to claim 1, wherein the sum of the first subset u and the second subset v is the number n of the bits of the data signal and the second subset v is smaller than the number m of the bits of the second intermediate signal by 1.

3. The modulation arrangement according to claim 1, wherein the combination device comprises a unit for adding the first intermediate signal and the second part of the data signal, as well as a unit for appending a carry of the addition to a lowest-order position of the second intermediate signal.

4. The modulation arrangement according to claim 1, wherein the combination device comprises a unit for shifting all bits of the second part of the data signal to the left by one position, as well as a unit for adding the first intermediate signal.

5. The modulation arrangement according to claim 4, wherein the input is coupled to the pre-modulator via a multiplication device for multiplying the data signal by an adjustable factor, and wherein a division device for dividing the current by the adjustable factor is connected in series coupled to the switchable current source.

6. The modulation arrangement according to claim 5, wherein the adjustable factor is a multiple of 2 such that a highest-order bit of the data signal is 1 after the multiplication.

7. The modulation arrangement according to claim 1, wherein the main clock pulse is the product of the pre-clock pulse and an exponential expression of an exponent that is formed by the number m of the bits of the second intermediate signal and the base 2.

8. The modulation arrangement according to claim 1, wherein the pre-modulator and/or the main modulator comprises a pulse-width modulator or a sigma-delta modulator.

9. A control arrangement for use in a portable device, comprising:
   a modulation arrangement according to claim 1, to the output of which a first connection of an electrical component is connected so that it can be controlled, and a DC/DC converter connected to a second connection of the electrical component in order to provide an output voltage.

10. A method for providing a modulated control signal, comprising the steps of:
    supplying a data signal with a width of n bits;
    modulating a first part of the data signal that comprises a first subset u of the n bits and providing a first intermediate signal with a width of one bit;
    combining the first intermediate signal with a second part of the data signal that comprises a second subset v of the n bits and providing a second intermediate signal with a width of m bits; and
    modulating the second intermediate signal and providing the modulated control signal,
    wherein the modulated control signal has a frequency higher than 20 kHz and a width of one bit, and
    wherein the step of combining the first intermediate signal with the second part of the data signal comprises an addition of the second part of the data signal and the first intermediate signal and appending a carry of the addition to a lowest-order position of the second intermediate signal.

11. A method for providing a modulated control signal, comprising the steps of:

supplying a data signal with a width of n bits;

modulating a first part of the data signal that comprises a first subset u of the n bits and providing a first intermediate signal with a width of one bit;

combining the first intermediate signal with a second part of the data signal that comprises a second subset v of the n bits and providing a second intermediate signal with a width dm bits; and modulating the second intermediate signal and providing the modulated control signal, wherein the modulated control signal has a frequency higher than 20 kHz and a width of one bit, and wherein the step of combining the first intermediate signal with the second part of the data signal comprises shifting all bits of the second part of the data signal to the left by one position and appending the bit of the first intermediate signal to a lowest-order position of the second intermediate signal.

12. The method according to claim 11, wherein the step of supplying the data signal comprises a multiplication of the data signal by a multiple of the factor 2.

* * * * *